United States Patent
Nakamoto (10) Patent No.: US 10,362,676 B1
(45) Date of Patent: Jul. 23, 2019

(54) SUBSTRATE AND ELECTRONIC DEVICE

(71) Applicant: FUJITSU LIMITED, Kawasaki-shi, Kanagawa (JP)

(72) Inventor: Shinichi Nakamoto, Tachikawa (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/242,040

(22) Filed: Jan. 8, 2019

(30) Foreign Application Priority Data

Jan. 25, 2018 (JP) ................. 2018-010914

(51) Int. Cl.
*H05K 1/11* (2006.01)
*H01L 23/498* (2006.01)
*H05K 1/02* (2006.01)
*H05K 1/18* (2006.01)

(52) U.S. Cl.
CPC ........ *H05K 1/116* (2013.01); *H01L 23/49822* (2013.01); *H05K 1/0298* (2013.01); *H05K 1/181* (2013.01); *H05K 2201/0969* (2013.01); *H05K 2201/09754* (2013.01)

(58) Field of Classification Search
CPC ........... H05K 1/11; H05K 1/115; H05K 1/116
See application file for complete search history.

(56) References Cited

U.S. PATENT DOCUMENTS

2010/0032195 A1  2/2010  Hayashi

FOREIGN PATENT DOCUMENTS

| JP | 2002-374048 | 12/2002 |
| JP | 2010-062530 | 3/2010 |
| JP | 2015-146382 | 8/2015 |

*Primary Examiner* — Jeremy C Norris
(74) *Attorney, Agent, or Firm* — Fujitsu Patent Center (57) ABSTRACT

Provided is a substrate including a first wiring layer coupled to another wiring layer through a plurality of vias, wherein in the first wiring layer, an area of a first region except an aperture is greater than an area of a second region except an aperture, the first region being enclosed by a first line segment passing through a first connection part of a first via and being parallel to a first short side of the first wiring layer and a second line segment passing through a second connection part of a second via and being parallel to the first short side, the second region being enclosed by the second line segment and a third line segment passing through a third connection part of a third via and being parallel to the first short side, the first, second, and third connection parts connecting to the first wiring layer.

17 Claims, 9 Drawing Sheets

SUBSTRATE AND ELECTRONIC DEVICE

CROSS-REFERENCE TO RELATED APPLICATION

This application is based upon and claims the benefit of priority of the prior Japanese Patent Application No. 2018-010914 filed on Jan. 25, 2018, the entire contents of which are incorporated herein by reference.

FIELD

A certain aspect of the embodiments is related to a substrate and an electronic device.

BACKGROUND

When a plurality of vias are coupled to a wiring layer provided to a substrate, current may crowd into a particular via. Thus, a method for inhibiting current from crowding into a particular via is suggested. One example is a method that inhibits current from crowding into the vias at both ends by making the electrical resistance of the wiring layer in the regions between the vias at both ends and the vias next to the vias at both ends greater than the electrical resistance in other regions as disclosed in, for example, Japanese Patent Application Publication No. 2010-62530. In addition, a method that averages the currents flowing through a plurality of vias by configuring the central points of the vias to be included in a region within a predetermined distance from the center point of the power supply pad has been known, as disclosed in, for example, Japanese Patent Application Publication No. 2015-146382.

Furthermore, a method that reduces the variation in power-supply voltage in a circuit substrate by arranging a Large Scale Integration (LSI) having the largest power consumption near the power source and configuring a power supply pattern from the power source to the LSI to be the widest as disclosed in, for example, Japanese Patent Application Publication No. 2002-374048.

SUMMARY

According to a first aspect of the embodiments, there is provided a substrate including a first wiring layer coupled to another wiring layer through a plurality of vias, wherein the first wiring layer has a structure in which an area of a first region, which is enclosed by a first line segment and a second line segment, except an aperture located in the first region is greater than an area of a second region, which is enclosed by the second line segment and a third line segment, except an aperture located in the second region, the first line segment passing through a first connection part of a first via of the plurality of vias and being parallel to a first short side of the first wiring layer, the second line segment passing through a second connection part of a second via of the plurality of vias and being parallel to the first short side, the third line segment passing through a third connection part of a third via of the plurality of vias and being parallel to the first short side, the first connection part, the second connection part, and the third connection part being connected to the first wiring layer.

According to a second aspect of the embodiments, there is provided an electronic device including a substrate having a first wiring layer coupled to another wiring layer through a plurality of vias, wherein the first wiring layer has a structure in which an area of a first region, which is enclosed by a first line segment and a second line segment, except an aperture located in the first region is greater than an area of a second region, which is enclosed by the second line segment and a third line segment, except an aperture located in the second region, the first line segment passing through a first connection part of a first via of the plurality of vias and being parallel to a first short side of the first wiring layer, the second line segment passing through a second connection part of a second via of the plurality of vias and being parallel to the first short side, the third line segment passing through a third connection part of a third via of the plurality of vias and being parallel to the first short side, the first connection part, the second connection part, and the third connection part being connected to the first wiring layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The method that makes the electrical resistance of the wiring layer in the regions between the vias at both ends and the vias next to the vias at both ends greater than the electrical resistances in other regions can inhibit current from crowding into the vias at both ends, but the current crowds into the vias next to the vias at both ends, and it is difficult to evenly flow current to the vias.

Hereinafter, embodiments of the present disclosure will be described with reference to the accompanying drawings.

First Embodiment

Figure 1A:
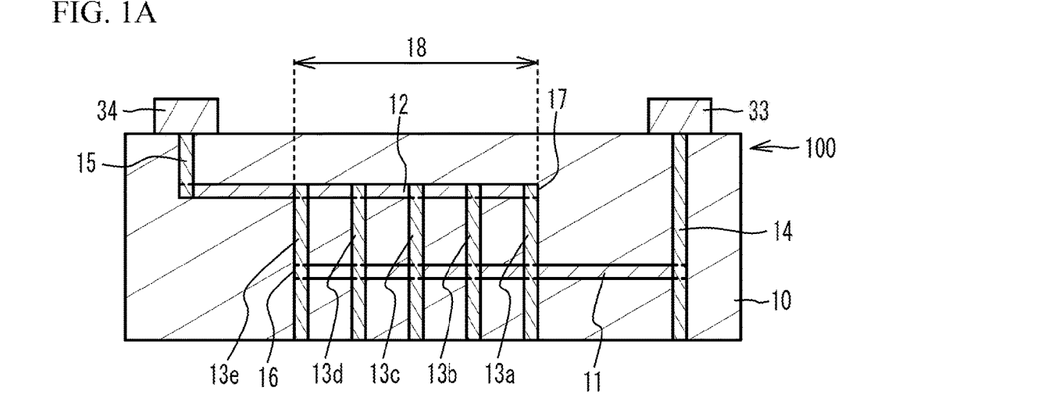
FIG. 1A is a cross-sectional view of a substrate in accordance with a first embodiment.
Figure 1B:
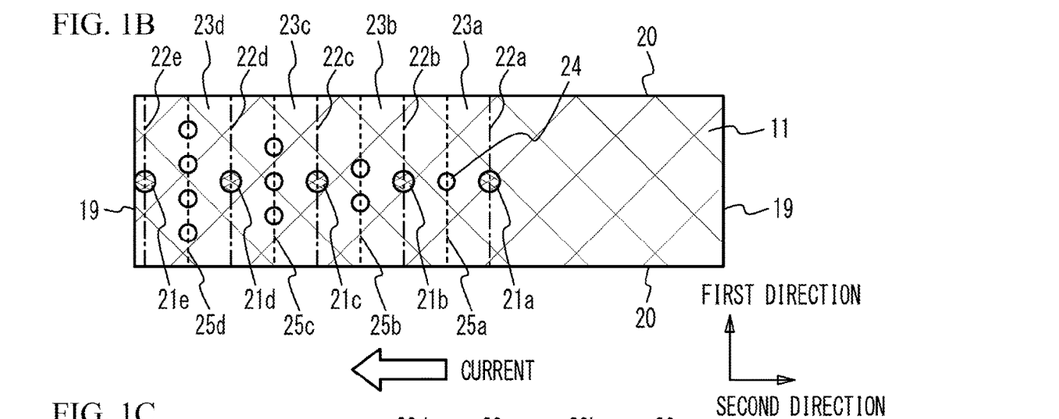
FIG. 1B and FIG. 1C are plan views of wiring layers.
Figure 1C:
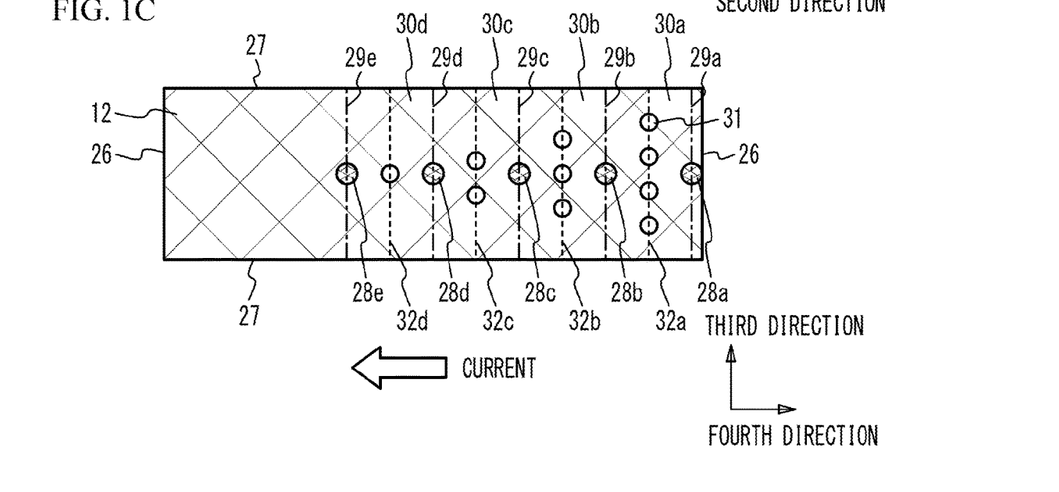

FIG. 1A is a cross-sectional view of a substrate 100 in accordance with a first embodiment, FIG. 1B is a plan view of a wiring layer 11, and FIG. 1C is a plan view of a wiring layer 12. As illustrated in FIG. 1A, the substrate 100 of the first embodiment is a printed circuit board having a multi-layered structure in which a plurality of wiring layers are stacked through an insulating film, and includes an insulating film 10, the wiring layers 11 and 12, and vias 13a through 13e, 14, and 15. The insulating film 10 is formed of a resin material such as epoxy or polyimide or a ceramic material such as aluminum oxide. The wiring layers 11 and 12 and the vias 13a through 13e, 14, and 15 are formed of a metal such as, for example, gold or copper.

A first end part of the wiring layer 11 is electrically connected through the via 14 to a power supply unit 33 located on the substrate 100. The power supply unit 33 is, for example, a DC-DC converter, but may be other than DC-DC converter. A first end part of the wiring layer 12 is electrically connected through the via 15 to an electronic component 34 located on the substrate 100. The electronic component 34 is, for example, a semiconductor component such as a Large Scale Integration (LSI), but may be other than the semiconductor component.

A second end part of the wiring layer 11 and a second end part of the wiring layer 12 overlap with each other across the insulating film 10 in the stacking direction of the wiring layers 11 and 12. That is, the part within a predetermined distance from an end 16 of the second end part of the wiring layer 11 and the part within a predetermined distance from an end 17 of the second end part of the wiring layer 12 overlap with each other across the insulating film 10 in the stacking direction of the wiring layers 11 and 12 to form an overlap region 18. The wiring layers 11 and 12 extend from the overlap region 18 in the opposite directions.

The vias 13a through 13e penetrate through the insulating film 10 in the overlap region 18 to connect the wiring layer 11 and the wiring layer 12. The vias 13a through 13e are arranged in a straight line from the end 16 of the wiring layer 11 along the wiring direction of the wiring layer 11 and are arranged in a straight line from the end 17 of the wiring layer 12 along the wiring direction of the wiring layer 12. Since the wiring layer 11 is coupled to the power supply unit 33, current flows from the wiring layer 11 to the wiring layer 12 through the vias 13a through 13e, and is then supplied to the electronic component 34 connected to the wiring layer 12. Among the vias 13a through 13e, the via 13a is located most upstream in the flow direction of current, and the vias 13b, 13c, 13d, and 13e are located in this order from the upstream to the downstream side.

As illustrated in FIG. 1B, the parts connecting to the wiring layer 11 of the vias 13a through 13e are respectively defined as connection parts 21a through 21e. Here, the direction parallel to a short side 19 of the wiring layer 11 is defined as a first direction, and the direction parallel to a long side 20 is defined as a second direction. In the wiring layer 11, the line segment that passes through the connection part 21a and is parallel to the first direction is defined as a line segment 22a. In the same manner, the line segment that passes through the connection part 21b and is parallel to the first direction is defined as a line segment 22b, and the line segment that passes through the connection part 21c and is parallel to the first direction is defined as the line segment 22c. The line segment that passes through the connection part 21d and is parallel to the first direction is defined as a line segment 22d, and the line segment that passes through the connection part 21e and is parallel to the first direction is defined as a line segment 22e. The line segments 22a through 22e are indicated by chain lines in FIG. 1B. The line segments 22a through 22e preferably pass through the centers of the connection parts 21a through 21e, respectively, but may pass through parts other than the centers.

In the wiring layer 11, the region enclosed by the opposed long sides 20, the line segment 22a, and the line segment 22b is defined as a region 23a. In the same manner, the region enclosed by the opposed long sides 20, the line segment 22b, and the line segment 22c is defined as a region 23b, the region enclosed by the opposed long sides 20, the line segment 22c, and the line segment 22d is defined as a region 23c, and the region enclosed by the opposed long sides 20, the line segment 22d, and the line segment 22e is defined as a region 23d.

The regions 23a through 23d have apertures 24 that are holes penetrating through the wiring layer 11. The diameters of the apertures 24 in the regions 23a through 23d are approximately the same. The term "approximately the same" includes a difference to the extent of the manufacturing errors (the same applies hereinafter). For the number of the apertures 24 in the regions 23a through 23d, the number of the apertures 24 is the smallest in the region 23a, and increases in the order of the regions 23b, 23c, and 23d. That is, the number of the apertures 24 is the smallest in the region 23a located upstream in the flow direction of current, and increases in the order of the regions 23b, 23c, and 23d, i.e., as the region is located further downstream in the flow direction of current. In the regions 23a through 23d, the apertures 24 are arranged in a straight line in the first direction.

In the wiring layer 11, the line segment passing through the aperture 24 in the region 23a and being parallel to the first direction is defined as a line segment 25a. In the same manner, the line segment passing through the apertures 24 in the region 23b and being parallel to the first direction is defined as a line segment 25b, the line segment passing through the apertures 24 in the region 23c and being parallel to the first direction is defined as a line segment 25c, and the line segment passing through the apertures 24 in the region 23d and being parallel to the first direction is defined as a line segment 25d. The line segments 25a through 25d are indicated by dashed lines in FIG. 1B. For the lengths of the parts of the line segments 25a through 25d except the apertures 24, the line segment 25a is the longest, followed by the line segments 25b, 25c, and 25d.

Thus, for the areas of the regions 23a through 23d except the apertures 24, the region 23a is the largest, followed by the regions 23b, 23c, and 23d. Thus, among the regions 23a through 23d, the electrical resistance of the region 23a is the smallest, and the electrical resistance increases in the order of the regions 23b, 23c, and 23d. That is, the electrical resistances of the regions 23a through 23d gradually increase from the region 23a located upstream in the flow direction of current to the region 23d located downstream.

As illustrated in FIG. 1C, the parts connecting to the wiring layer 12 of the vias 13a through 13e are respectively defined as connection parts 28a through 28e. Here, the direction parallel to a short side 26 of the wiring layer 12 is defined as a third direction, and the direction parallel to a long side 27 is defined as a fourth direction. In the wiring layer 12, the line segment that passes through the connection part 28a and is parallel to the third direction is defined as a line segment 29a. In the same manner, the line segment that passes through the connection part 28b and is parallel to the third direction is defined as a line segment 29b, and the line segment that passes through the connection part 28c and is parallel to the third direction is defined as a line segment 29c. The line segment that passes through the connection part 28d and is parallel to the third direction is defined as a line segment 29d, and the line segment that passes through the connection part 28e and is parallel to the third direction is defined as a line segment 29e. The line segments 29a through 29e are indicated by chain lines in FIG. 1C. The line segments 29a through 29e preferably pass through the centers of the connection parts 28a through 28e, but may pass through the parts other than the center.

In the wiring layer 12, the region enclosed by the opposed long sides 27, the line segment 29a, and the line segment 29b is defined as a region 30a. In the same manner, the region enclosed by the opposed long sides 27, the line segment 29b, and the line segment 29c is defined as a region 30b, the region enclosed by the opposed long sides 27, the line segment 29c, and the line segment 29d is defined as a region 30c, and the region enclosed by the opposed long sides 27, the line segment 29d, and the line segment 29e is defined as a region 30d.

The regions 30a through 30d have apertures 31 that are holes penetrating through the wiring layer 12. The diameters of the apertures 31 in the regions 30a through 30d are approximately the same. For the number of the apertures 31 in the regions 30a through 30d, the number of the apertures 31 is the largest in the region 30a, and decreases in the order of the regions 30b, 30c, and 30d. That is, the number of the apertures 31 in the region 30a located upstream in the flow direction of current is the largest, and the number of the apertures 31 decreases in the order of the regions 30b, 30c, and 30d, i.e., as the region is located further downstream in the flow direction of current. In the regions 30a through 30d, the apertures 31 are arranged in a straight line in the third direction.

In the wiring layer 12, the line segment passing through the apertures 31 in the region 30a and being parallel to the third direction is defined as a line segment 32a. In the same manner, the line segment passing through the apertures 31 in the region 30b and being parallel to the third direction is defined as a line segment 32b, the line segment passing through the apertures 31 in the region 30c and being parallel to the third direction is defined as a line segment 32c, and the line segment passing through the aperture 31 in the region 30d and being parallel to the third direction is defined as a line segment 32d. The line segments 32a through 32d are indicated by dashed lines in FIG. 1C. For the lengths of the parts except the apertures 31 of the line segments 32a through 32d, the line segment 32a is the shortest, followed by the line segments 32b, 32c, and 32d.

Thus, for the areas of the regions 30a through 30d except the apertures 31, the region 30a is the smallest, followed by the regions 30b, 30c, and 30d. Thus, among the regions 30a through 30d, the region 30a has the largest electrical resistance, and the electrical resistance decreases in the order of the regions 30b, 30c, and 30d. That is, the electrical resistances of the regions 30a through 30d gradually decrease from the region 30a, which is located upstream in the flow direction of current, and to the region 30d, which is located downstream.

Figure 2A:
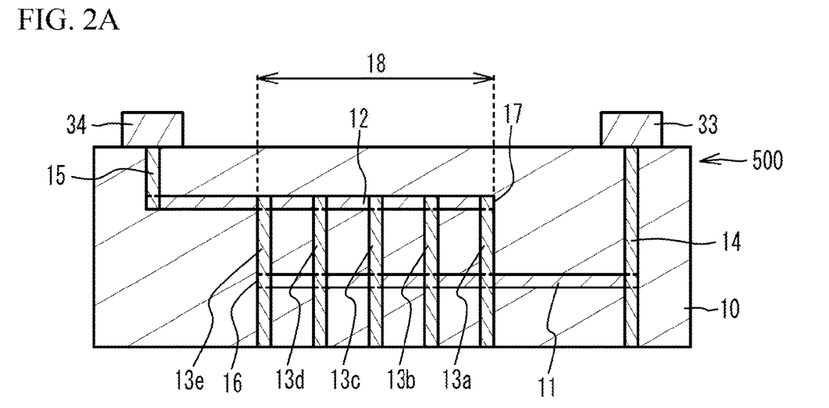
FIG. 2A is a cross-sectional view of a substrate in accordance with a first comparative example.
Figure 2B:
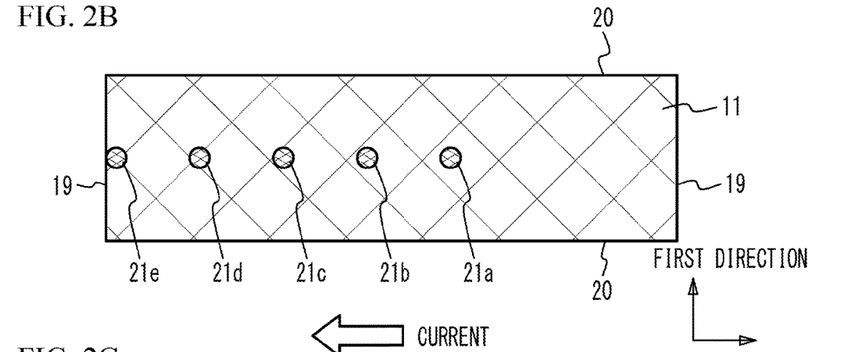
FIG. 2B and FIG. 2C are plan views of wiring layers.
Figure 2C:
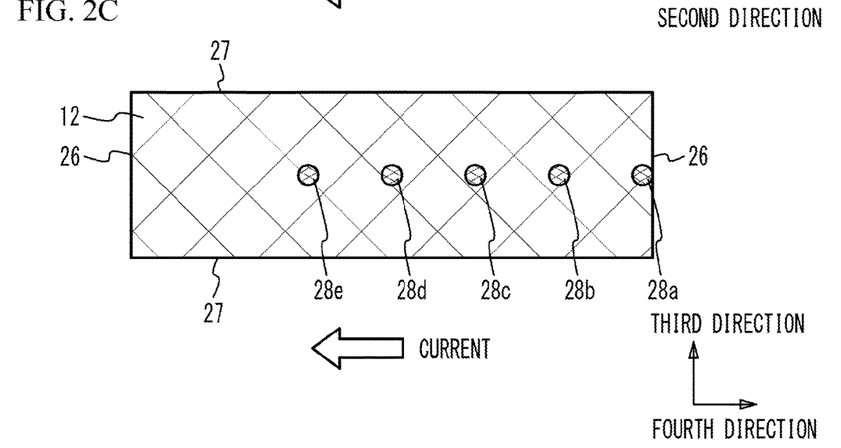

Here, to describe the advantage of the substrate of the first embodiment, a substrate of a first comparative example will be described. FIG. 2A is a cross-sectional view of a substrate 500 in accordance with the first comparative example, FIG. 2B is a plan view of the wiring layer 11, and FIG. 2C is a plan view of the wiring layer 12. As illustrated in FIG. 2A through FIG. 2C, in the substrate 500 of the first comparative example, no aperture 24 is provided in the wiring layer 11, and no aperture 31 is provided in the wiring layer 12. Other structures are the same as those of the first embodiment, and the description thereof is thus omitted.

Figure 3A:
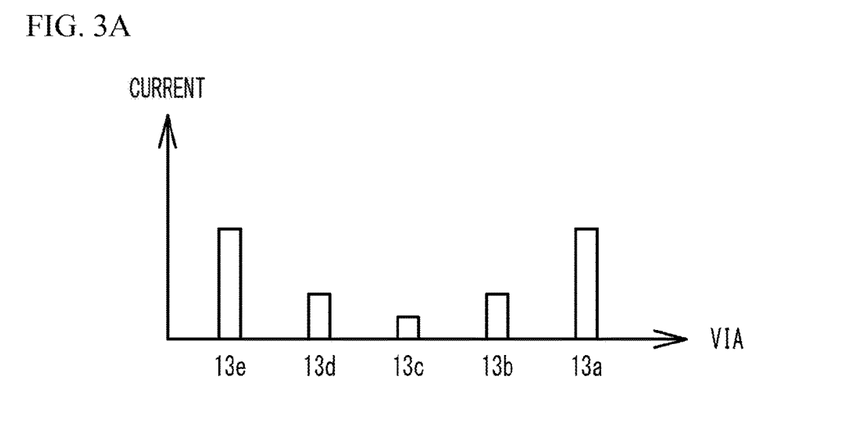
FIG. 3A is a diagram for describing the current flowing through vias of the substrate in accordance with the first comparative example.
Figure 3B:
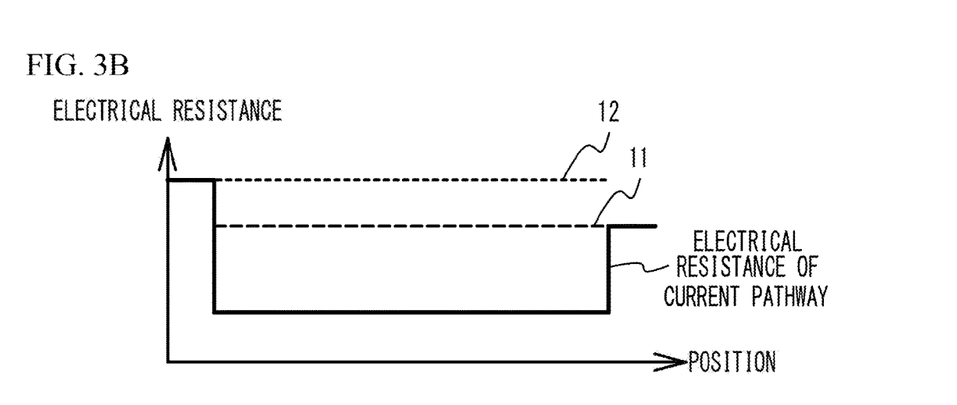
FIG. 3B is a diagram for describing electrical resistance in the substrate in accordance with the first comparative example.

FIG. 3A is a diagram for describing the current flowing through the vias 13a through 13e of the substrate 500 in accordance with the first comparative example, and FIG. 3B is a diagram for describing the electrical resistance in the substrate 500 of the first comparative example. As illustrated in FIG. 3A, in the substrate 500 of the first comparative example, current crowds into the vias 13a and 13e at both ends among the vias 13a through 13e. In other words, current crowds into the via 13a, which is located most upstream in the flow direction of the current flowing through the wiring layer 11, and the via 13e, which is located most downstream among the vias 13a through 13e. The reason is considered as follows.

That is, as illustrated in FIG. 2A, when the wiring layer 12 is coupled through the vias 13a through 13e to the wiring layer 11 through which current supplied from the power supply unit 33 flows, the wiring layer 12 is added as a pathway through which current flows. To flow the current through the wiring layer 12, the current crowds into the via 13a located most upstream in the flow direction of the current flowing through the wiring layer 11. In the via 13e located most downstream, the wiring layer 11 ends, and the pathway through which current flows is thus reduced. Therefore, the current crowds into the via 13e. From another perspective, the via 13a is a changing point at which the pathway of the current changes from one pathway, which is the wiring layer 11, to two pathways, which are the wiring layers 11 and 12 connected in parallel. The via 13e is a changing point at which the pathway of the current changes from two pathways, which are the wiring layers 11 and 12 connected in parallel, to one pathway, which is the wiring layer 12. At such changing points, the electrical resistance of the current pathway greatly changes as illustrated in FIG. 3B. Thus, the current crowds into the vias 13a and 13e. When the current crowds into the vias 13a and 13e, the current densities of the vias 13a and 13e increase, and thereby a break due to electromigration may be caused.

Figure 4A:
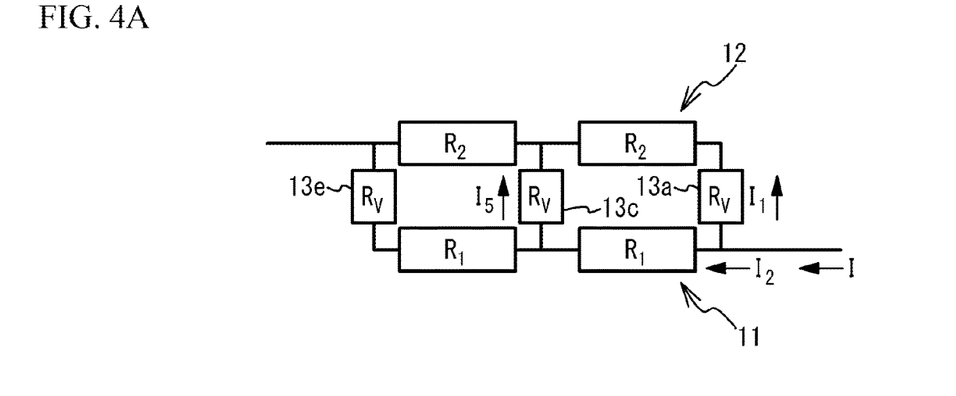
FIG. 4A through FIG. 4C are circuit diagrams for describing a reason why current crowds into the vias at both ends among vias of the substrate of the first comparative example.
Figure 4B:
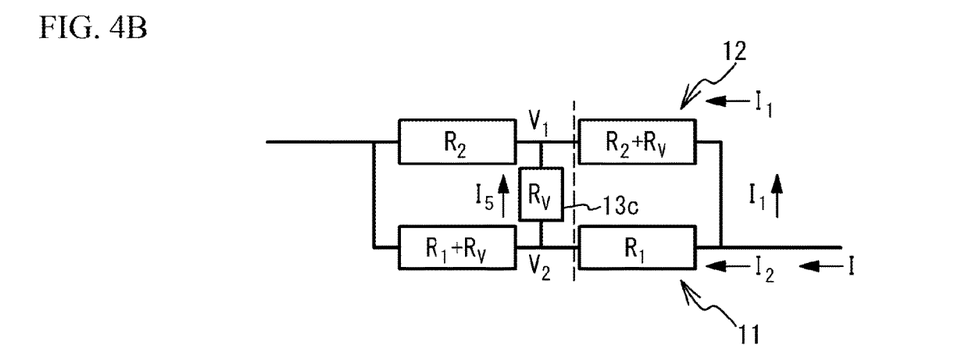
Figure 4C:
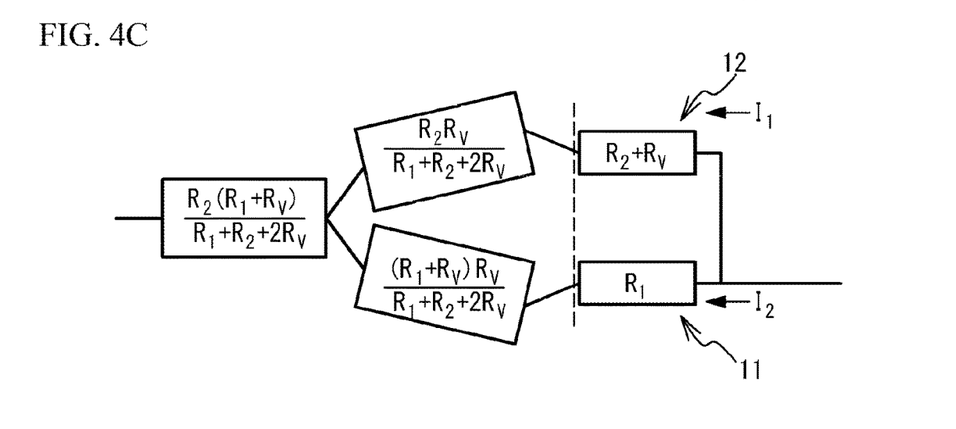

FIG. 4A through FIG. 4C are circuit diagrams for describing a reason why current crowds into the vias 13a and 13e at both ends in the substrate 500 of the first comparative example. In FIG. 4A through FIG. 4C, for the sake of shorthand, it is assumed that the wiring layer 11 and the wiring layer 12 are coupled by three vias 13a, 13c, and 13e. As illustrated in FIG. 4A, it is assumed that the electrical resistance of the wiring layer 11 is $R_1$, the electrical resistance of the wiring layer 12 is $R_2$, and the electrical resistance of each of the vias 13a, 13c, and 13e is $R_V$. It is assumed that the current I flowing through the wiring layer 11 diverges into the current $I_1$ and the current $I_2$ at the connection point of the via 13a. The current flowing through the via 13c is represented by $I_5$. As illustrated in FIG. 4B, when the electrical resistance $R_1$ of the wiring layer 11 and the electrical resistance $R_V$ of the via 13e are combined, and the electrical resistance $R_2$ of the wiring layer 12 and the electrical resistance $R_V$ of the via 13a are combined, a bridge circuit is formed. When the part located on the left side of the dashed line in FIG. 4B is rewritten, the circuit diagram becomes as illustrated in FIG. 4C.

In this case, the current $I_1$ and the current $I_2$ are expressed by $$I_1 = \frac{R_1 + \frac{(R_v + R_1)R_v}{(R_1 + R_2 + 2R_v)}}{(R_1 + R_2 + R_v) + \frac{(R_1 + R_2 + R_v)R_v}{(R_1 + R_2 + 2R_v)}} I, \qquad (1)$$

$$I_2 = \frac{R_2 + R_v + \frac{R_2 R_v}{(R_1 + R_2 + 2R_v)}}{(R_1 + R_2 + R_v) + \frac{(R_1 + R_2 + R_v)R_v}{(R_1 + R_2 + 2R_v)}} I. \qquad (2)$$

The voltages $V_1$ and $V_2$ at both ends of the via 13c are expressed by $$V_1 = (R_2 + R_v)I_1, \quad (3)$$

$$V_2 = R_1 I_2. \quad (4)$$

Therefore, the current $I_5$ flowing through the via 13c is expressed by $$I_5 = (V_1 - V_2)/R_v = \frac{1}{\frac{R_1 + R_2}{R_v} + 3} I. \quad (5)$$

Here, since a plurality of vias are connected in parallel, the electrical resistances $R_V$ of the vias 13a, 13c, and 13e are assumed to be sufficiently small compared to the electrical resistances $R_1$ and $R_2$ of the wiring layers 11 and 12. In this case, the currents $I_1$, $I_2$, and $I_5$ are expressed by $$I_1 = \frac{R_1}{R_1 + R_2} I, \quad (6)$$

$$I_2 = \frac{R_2}{R_1 + R_2} I, \quad (7)$$

$$I_5 = \frac{1}{\frac{R_1 + R_2}{R_v} + 3} I \cong \frac{R_v}{R_1 + R_2} I \ll I. \quad (8)$$

As expressed by the expressions (6) through (8), the currents $I_1$ and $I_2$ are determined by the ratio between the electrical resistance $R_1$ and the electrical resistance $R_2$, while the current $I_5$ is determined by the ratio between the electrical resistance $R_V$ and the electrical resistances $R_1$ and $R_2$. As described above, since the electrical resistance $R_V$ is sufficiently small compared to the resistances $R_1$ and $R_2$, the current $I_5$ flowing through the via 13c is less than the current $I_1$ flowing through the via 13a. The same applies to the via 13e, and the current $I_5$ flowing through the via 13c is less than the current flowing through the via 13e. Thus, current crowds into the via 13a, which is located most upstream in the flow direction of the current flowing through the wiring layer 11, and the via 13e, which is located most downstream.

Even when the wiring layer is thickened, the diameters of the vias other than the vias at both ends among the vias connecting between the wiring layers are increased, or the number of vias connecting between the wiring layers is increased, it is difficult to inhibit the current from crowding into the vias at both ends.

Figure 5A:
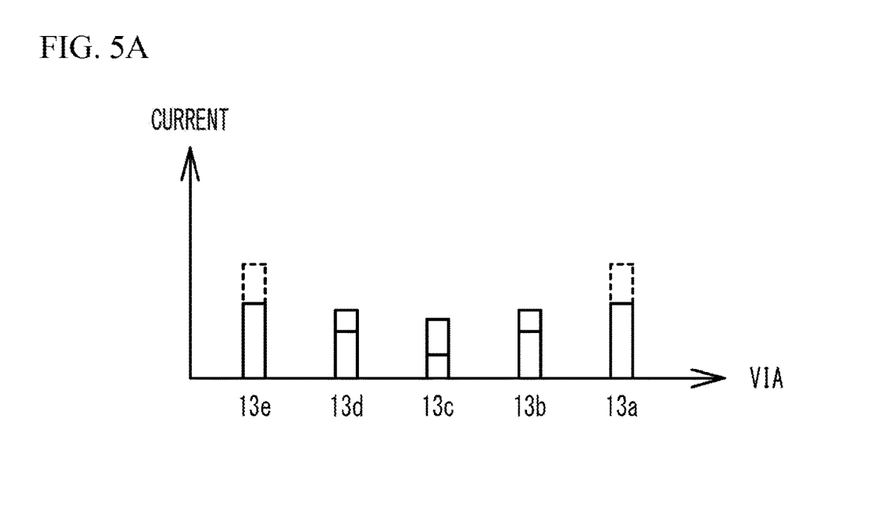
FIG. 5A is a diagram for describing the current flowing through vias of the substrate of the first embodiment.
Figure 5B:
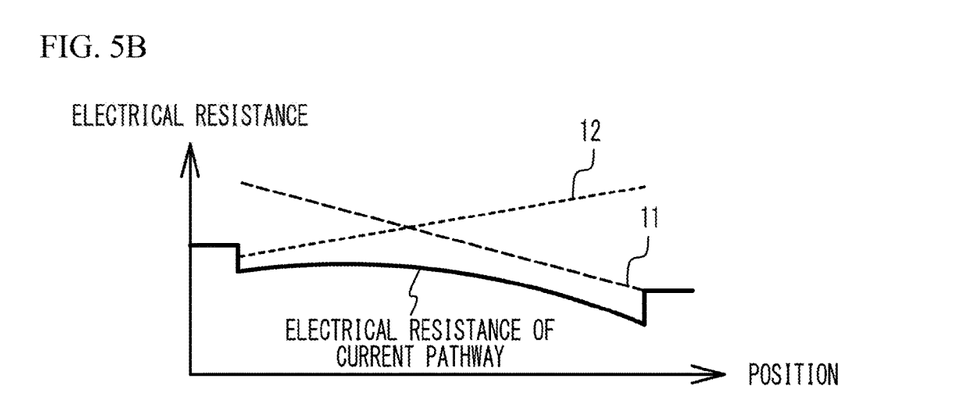
FIG. 5B is a diagram for describing electrical resistance in the substrate of the first embodiment.

FIG. 5A is a diagram for describing the current flowing through the vias 13a through 13e of the substrate 100 of the first embodiment, and FIG. 5B is a diagram for describing the electrical resistance in the substrate 100 of the first embodiment. As illustrated in FIG. 5A, in the substrate 100 of the first embodiment, the current evenly flows through the vias 13a through 13e, and the current is inhibited from crowding into the vias 13a and 13e at both ends. The reason is considered as follows.

That is, as illustrated in FIG. 1B, in the wiring layer 11, among the regions 23a through 23d, the area of the region excluding the apertures 24 is the largest in the region 23a, and decreases in the order of the regions 23b, 23c, and 23d, i.e., as the region is located further downstream in the flow direction of current. Thus, the electrical resistance of the region 23a located upstream in the flow direction of current is the smallest, and the electrical resistance increases in the order of the regions 23b, 23c, and 23d, i.e., as the region is located further downstream in the flow direction of current. Since the electrical resistance of the region 23a is less than the electrical resistances of the regions 23b through 23d located further downstream than the region 23a, the current flowing through the wiring layer 11 flows more easily to the wiring layer 11 than to the via 13a in the vicinity of the connection part 21a connecting to the wiring layer 11 of the via 13a. Thus, the current flowing through the via 13a reduces, and the current flowing through the vias 13b through 13d is increased. Since the electrical resistance increases in the order of the regions 23b, 23c, and 23d, it gradually becomes difficult for the current to flow to the wiring layer 11, and the current flowing into the vias 13b through 13d gradually increases. Since the electrical resistance of the region 23d is high, it is difficult for the current to flow through the wiring layer 11 in the vicinity of the connection part 21d connecting to the wiring layer 11 of the via 13d, and the current flowing into the via 13e thus reduces. For the above described reasons, it is considered that the current is inhibited from crowding into the vias 13a and 13e, and the current evenly flows into the vias 13a through 13e.

As illustrated in FIG. 1C, in the wiring layer 12, among the regions 30a through 30d, the area of the region excluding the apertures 31 is the smallest in the region 30a, which is located upstream in the flow direction of current, and increases in the order of the regions 30b, 30c, and 30d, i.e., as the region is located further downstream in the flow direction of current. Therefore, the electrical resistance of the region 30a located upstream in the flow direction of current is the largest, and the electrical resistance decreases in the order of the regions 30b, 30c, and 30d, i.e., as the region is located further downstream in the flow direction of current. It is considered that the current is unlikely to flow into the via 13a because of the high electrical resistance of the region 30a. Since the electrical resistance decreases in the order of the regions 30b, 30c, and 30d, the current flowing through the vias 13b through 13d gradually increases. Therefore, the current effectively evenly flows through the vias 13a through 13e by sequentially decreasing the electrical resistances of the regions 30a through 30d in addition to sequentially increasing the electrical resistances of the regions 23a through 23d of the wiring layer 11.

As illustrated in FIG. 5B, it is considered that when the electrical resistance of the wiring layer 11 gradually increases and the electrical resistance of the wiring layer 12 gradually decreases from the upstream to the downstream side in the flow direction of current, the rapid change in the resistance of the current pathway is inhibited. This is also considered as a reason why the current is inhibited from crowding into the vias 13a and 13e and the current evenly flows through the vias 13a through 13e.

Figure 6A:
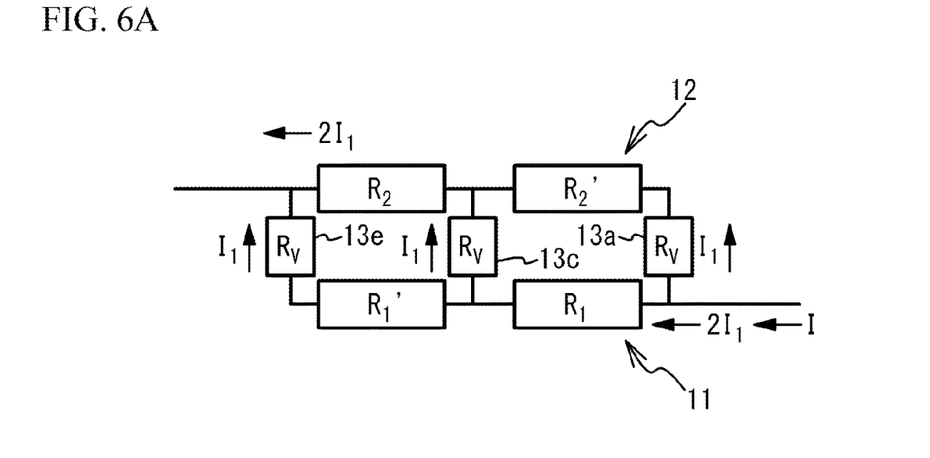
FIG. 6A and FIG. 6B are circuit diagrams for describing a reason why current evenly flows to vias of the substrate of the first embodiment.
Figure 6B:
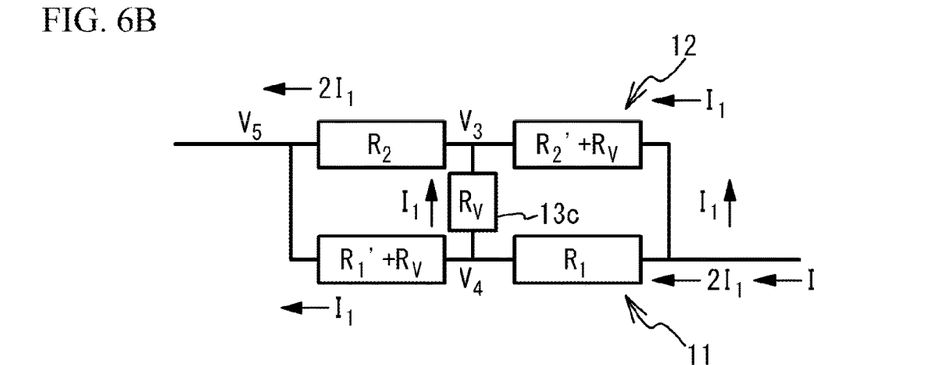

FIG. 6A and FIG. 6B are circuit diagrams for describing a reason why the current evenly flows through the vias of the substrate 100 of the first embodiment. In FIG. 6A and FIG. 6B, for the sake of shorthand, it is assumed that the wiring layer 11 and the wiring layer 12 are connected by three vias 13a, 13c, and 13e. As illustrated in FIG. 6A, since the electrical resistance of the wiring layer 11 increases from the upstream side to the downstream side in the flow direction of current, it is assumed that the electrical resistance of the upstream part of the wiring layer 11 is $R_1$, and the electrical resistance of the downstream part of the wiring layer 11 is $R_1{'}$ greater than $R_1$. Since the electrical resistance of the wiring layer 12 decreases from the upstream side to the downstream side in the flow direction of current, it is assumed that the electrical resistance of the downstream part of the wiring layer 12 is $R_2$, and the electrical resistance of the upstream part of the wiring layer 12 is $R_2{'}$ greater than $R_2$. The electrical resistance of each of the vias 13a, 13c, and 13e is represented by $R_V$. When the current is assumed to evenly flow through the vias 13a, 13c, and 13e, the current flowing through each of the vias 13a, 13c, and 13e is represented by $I_1$. Since the resistance of the upstream part of the wiring layer 11 is small and it is thus easy for the current to flow through the upstream part of the wiring layer 11, it is assumed that the current I flowing through the wiring layer 11 diverges into the current $I_1$ and the current $2I_1$ at the connection point of the via 13a. In the same manner, since the resistance of the downstream part of the wiring layer 12 is small and it is thus easy for the current to flow through the downstream part of the wiring layer 12, it is assumed that the current flowing through the downstream part of the wiring layer 12 is $2I_1$. As illustrated in FIG. 6B, when the electrical resistance $R_1{'}$ of the wiring layer 11 and the electrical resistance $R_V$ of the via 13e are combined, and the electrical resistance $R_2{'}$ of the wiring layer 12 and the electrical resistance $R_V$ of the via 13a are combined, a bridge circuit is formed.

In this case, the voltages $V_3$ and $V_4$ at both ends of the via 13c are expressed by $$V_3 = I_1(R_2{'} + R_v), \quad (9)$$

$$V_4 = 2I_1 R_1. \quad (10)$$

The voltage $V_5$ of the wiring layer 12 at a point posterior to the via 13e is expressed by $$V_5 = I_1(R_2{'} + R_v) + 2I_1 R_2 = 2I_1 R_1 + I_1(R_1{'} + R_v). \quad (11)$$

The following expressions (12) and (13) are obtained from the expressions (9) through (11).

$$R_1{'} = 2R_2 \quad (12)$$

$$R_2{'} = 2R_1 \quad (13)$$

From the expressions (12) and (13), it is considered that when the resistance $R_1{'}$ of the downstream part of the wiring layer 11 and the resistance $R_2{'}$ of the upstream part of the wiring layer 12 increase, the current is inhibited from crowding into the vias 13a and 13e, and the current evenly flows through the vias 13a, 13c, and 13e.

In the first embodiment, in the wiring layer 11, the area of the region 23a except the aperture 24 is greater than the area of the region 23b except the apertures 24 as illustrated in FIG. 1B. In addition, in the wiring layer 11, the area of the region 23b except the apertures 24 is greater than the area of the region 23c except the apertures 24. Furthermore, in the wiring layer 11, the area of the region 23c except the apertures 24 is greater than the area of the region 23d except the apertures 24. Thus, the electrical resistance of the wiring layer 11 gradually increases from the upstream side to the downstream side in the flow direction of current, and the current is inhibited from crowding into the vias 13a and 13e at both ends among the vias 13a through 13e as described in FIG. 5A. Thus, the current is made to evenly flow through the vias 13a through 13e.

As illustrated in FIG. 1C, in the wiring layer 12, the area of the region 30a except the apertures 31 is less than area of the region 30b except the apertures 31. In addition, in the wiring layer 12, the area of the region 30b except the apertures 31 is less than the area of the region 30c except the apertures 31. Furthermore, in the wiring layer 12, the area of the region 30c except the apertures 31 is less than the area of the region 30d except the aperture 31. Thus, since the electrical resistance of the wiring layer 12 gradually decreases from the upstream side to the downstream side in the flow direction of current, as described in FIG. 5A, the current is made to effectively evenly flow through the vias 13a through 13e thanks to the synergy with the advantage obtained by gradually increasing the electrical resistance of the wiring layer 11 from the upstream side to the downstream side in the flow direction of current.

Figure 7A:
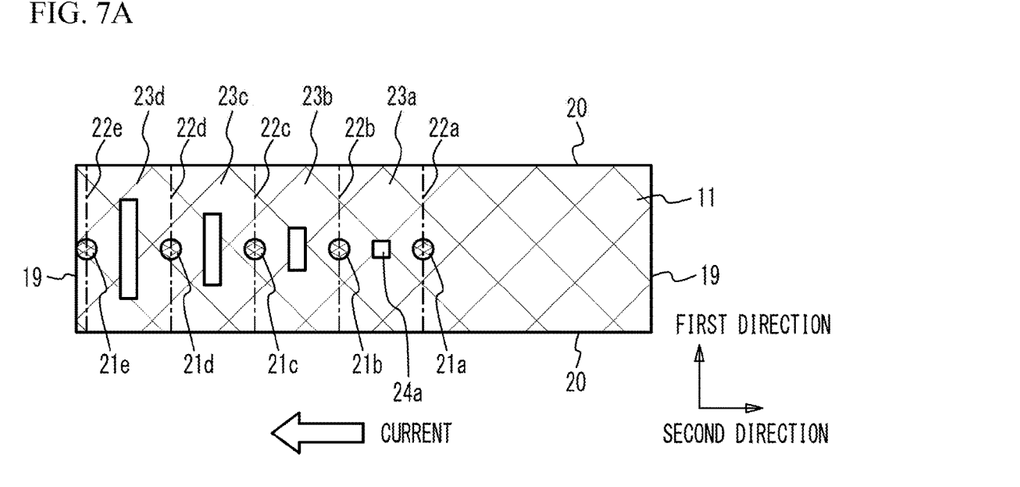
FIG. 7A and FIG. 7B are plan views illustrating other examples of the wiring layer.
Figure 7B:
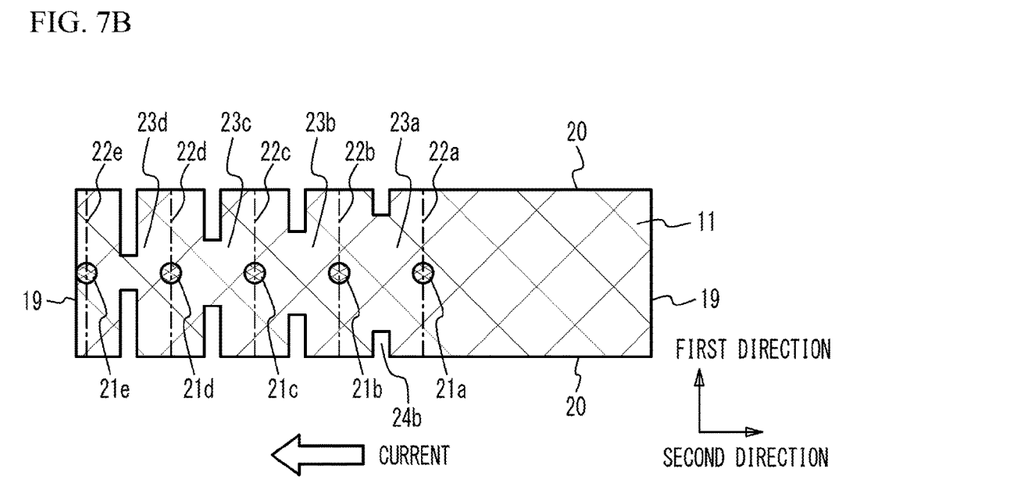

As illustrated in FIG. 1B, the number of the apertures 24 in each of the regions 23a through 23d increases in the order of the regions 23a, 23b, 23c, and 23d. Thus, even when the thickness of the wiring layer 12 is made to be the same, the electrical resistance can be made to increase in the order of the regions 23a, 23b, 23c, and 23d. The first embodiment has described, as an example, a case where the area of each of the regions 23a, 23b, 23c, and 23d except the apertures 24 decreases in the order of the regions 23a, 23b, 23c, and 23d as the number of the apertures 24 in each of the regions 23a through 23d increases in the order of the regions 23a, 23b, 23c, and 23d, but does not intend to suggest any limitation. FIG. 7A and FIG. 7B are plan views illustrating other examples of the wiring layer. As illustrated in FIG. 7A, one aperture 24a, which is a hole, may be provided in each of the regions 23a through 23d, and the area of the aperture 24a may increase in the order of the regions 23a, 23b, 23c, and 23d. As illustrated in FIG. 7B, an aperture 24b may be a cutout located at the long side 20 of the wiring layer 11, and the area of the aperture 24b may increase in the order of the regions 23a, 23b, 23c, and 23d. When the sum of the areas of the apertures in each of the regions 23a through 23d increases in the order of the regions 23a, 23b, 23c, and 23d, the electrical resistance can be made to increase in the order of the regions 23a, 23b, 23c, and 23d while the thickness of the wiring layer 11 is made to be the same.

Figure 8A:
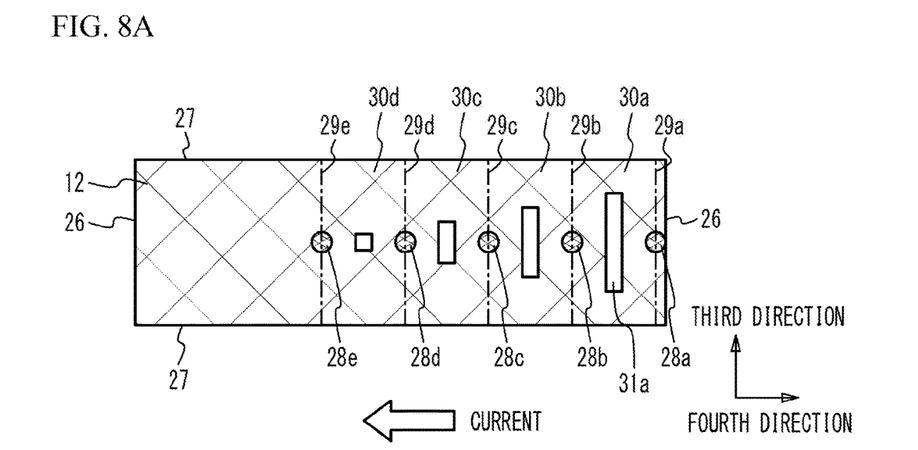
FIG. 8A and FIG. 8B are plan views illustrating other examples of the wiring layer.
Figure 8B:
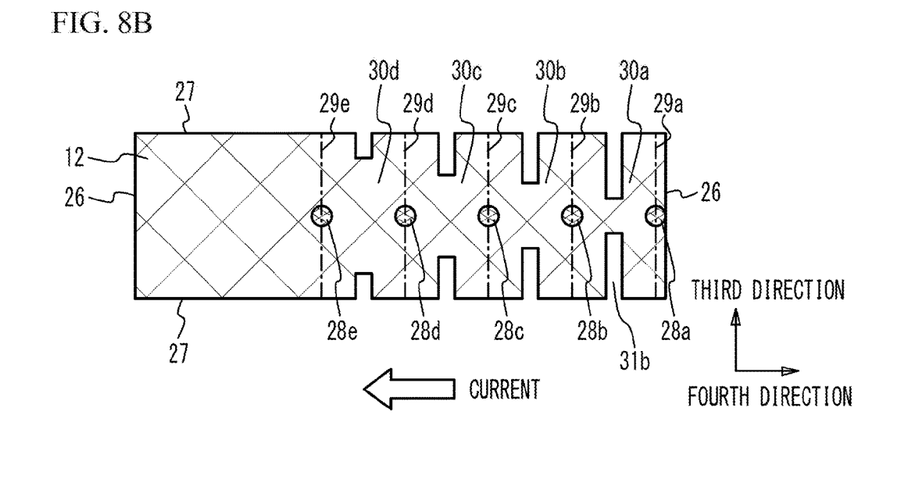

In the same manner, as illustrated in FIG. 1C, the number of the apertures 31 in each of the regions 30a through 30d decreases in the order of the regions 30a, 30b, 30c, and 30d. This configuration decreases the electrical resistance in the order of the regions 30a, 30b, 30c, and 30d while making the thickness of the wiring layer 12 the same. The first embodiment has described, as an example a case where the area of each of the regions 30a through 30d except the apertures 31 increases in the order of the regions 30a, 30b, 30c, and 30d as the number of the apertures 31 in each of the regions 30a through 30d decreases in the order of the regions 30a, 30b, 30c, and 30d. FIG. 8A and FIG. 8B are plan views illustrating other examples of the wiring layer. As illustrated in FIG. 8A, one aperture 31a, which is a hole, may be provided in each of the regions 30a through 30d, and the area of the aperture 31a may decrease in the order of the regions 30a, 30b, 30c, and 30d. As illustrated in FIG. 8B, an aperture 31b may be a cutout located at the long side 27 of the wiring layer 12, and the area of the aperture 31b may decrease in the order of the regions 30a, 30b, 30c, and 30d. As the sum of the areas of the apertures in each of the regions 30a through 30d decrease in the order of the regions 30a, 30b, 30c, and 30d, the electrical resistance can be made to decrease in the order of the regions 30a, 30b, 30c, and 30d while the thickness of the wiring layer 12 is made to be the same.

The first embodiment has described, as an example, a case where the apertures 24 through 24b provided in the wiring layer 11 penetrate through the wiring layer 11, but the apertures 24 through 24b may not necessarily penetrate through the wiring layer 11 and may have a bottom of the wiring layer 11. However, to easily adjust the electrical resistances in the regions 23a through 23d, the apertures 24 through 24b preferably penetrate through the wiring layer 11. In the same manner, a case where the apertures 31 through 31b provided in the wiring layer 12 penetrate through the wiring layer 12 has been described as an example, but the apertures 31 through 31b may not necessarily penetrate through the wiring layer 12 and may have a bottom of the wiring layer 12. However, to easily adjust the electrical resistances in the regions 30a through 30d, the apertures 31 through 31b preferably penetrate through the wiring layer 12.

The first embodiment has described, as an example, a case where the apertures 24 and 31 are circular holes as illustrated in FIG. 1B and FIG. 1C, but the apertures 24 and 31 may be rectangular holes or elliptical holes. The apertures 24a and 31a are not limited to rectangular holes illustrated in FIG. 7A and FIG. 8A, but may be elliptical holes. The apertures 24b and 31b are not limited to rectangular cutouts illustrated in FIG. 7B and FIG. 8B, and may be elliptical cutouts.

The first embodiment has described, as an example, a case where the wiring layers 11 and 12 are power supply layers to which a power-supply voltage is supplied from the power supply unit 33 and through which the current flows, but does not intend to suggest any limitation. The wiring layers 11 and 12 may be ground layers to which a ground potential is given from the electronic component 34 and through which the current flows toward a ground. However, when the wiring layers 11 and 12 are power supply layers, large current flows through the wiring layers 11 and 12. Thus, when the current crowds into the vias 13a and 13e at both ends among the vias 13a through 13e, a break is likely to occur. Therefore, when the wiring layers 11 and 12 are power supply layers, the aperture 24 is preferably provided in the wiring layer 11.

Second Embodiment

Figure 9A:
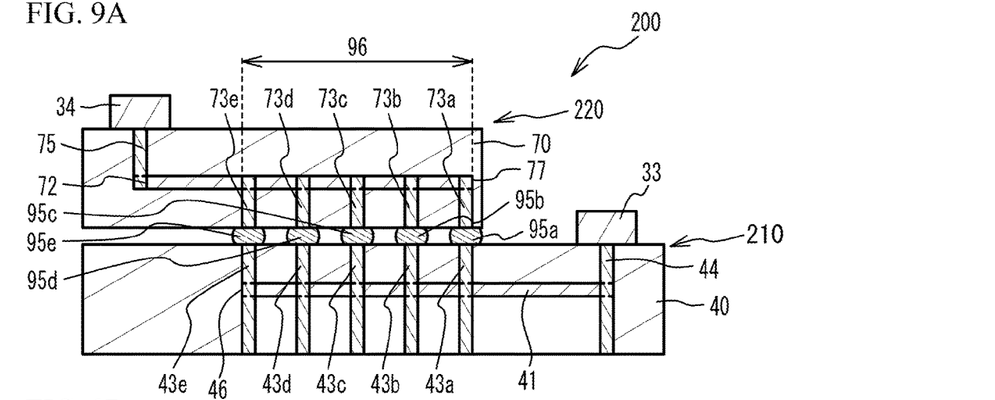
FIG. 9A is a cross-sectional view of an electronic device in accordance with a second embodiment.
Figure 9B:
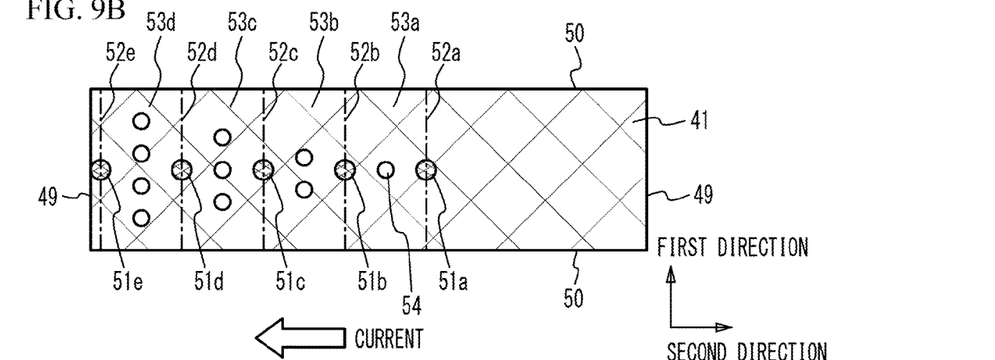
FIG. 9B and FIG. 9C are plan views of wiring layers.
Figure 9C:
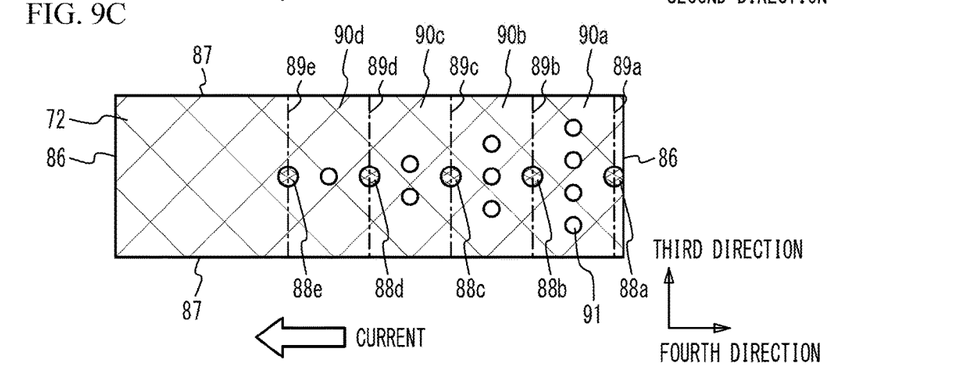

FIG. 9A is a cross-sectional view of an electronic device 200 in accordance with a second embodiment, FIG. 9B is a plan view of a wiring layer 41 of a substrate 210, and FIG. 9C is a plan view of a wiring layer 72 of a substrate 220. As illustrated in FIG. 9A, in the electronic device 200 of the second embodiment, the substrate 220 is mounted on the substrate 210 by connection members 95a through 95e. The connection members 95a through 95e are, for example, bumps such as solder. The substrate 210 is a printed circuit board in which a wiring layer is formed in an insulating film, and includes an insulating film 40, the wiring layer 41, and vias 43a through 43e and 44. The wiring layer 41 and the vias 43a through 43e and 44 are located in the insulating film 40. The first end part of the wiring layer 41 is electrically connected through the via 44 to the power supply unit 33 located on the substrate 210. The insulating film 40 is formed of, for example, a resin material such as epoxy or polyimide or a ceramic material such as aluminum oxide. The wiring layer 41 and the vias 43a through 43e and 44 are formed of metal such as, for example, gold or copper.

The substrate 220 is a printed circuit board in which a wiring layer is formed in an insulating film, and includes an insulating film 70, the wiring layer 72, and vias 73a through 73e and 75. The wiring layer 72 and the vias 73a through 73e and 75 are provided in the insulating film 70. A first end part of the wiring layer 72 is electrically connected through the via 75 to the electronic component 34 located on the substrate 220. The insulating film 70 is formed of, for example, a resin material such as epoxy or polyimide or a ceramic material such as aluminum oxide. The wiring layer 72 and the vias 73a through 73e and 75 are formed of metal such as, for example, gold or copper. The substrate 220 is not limited to a printed circuit board, and may be a semiconductor substrate in which a semiconductor element such as, for example, a transistor is formed.

In the part within a predetermined distance from an end 46 of a second end part of the wiring layer 41, vias 43a through 43e are arranged in a straight line in the wiring direction of the wiring layer 41 and connected to the wiring layer 41. In the same manner, in the part within a predetermined distance from an end 77 of a second end part of the wiring layer 72, vias 73a through 73e are arranged in a straight line in the wiring direction of the wiring layer 72 and connected to the wiring layer 72. The vias 43a through 43e and the vias 73a through 73e are respectively interconnected through respective connection members 95a through 95e. This structure mounts the substrate 220 on the substrate 210. That is, the part within a predetermined distance from the end 46 of the wiring layer 41 and the part within a predetermined distance from the end 77 of the wiring layer 72 overlap with each other in the direction in which the substrate 220 is mounted on the substrate 210 to form an overlap region 96. The wiring layers 41 and 72 extend from the overlap region 96 in opposite directions. The connection members 95a through 95e are located in the overlap region 96, and are arranged in a straight line in the wiring direction of the wiring layers 41 and 72. Since the wiring layer 41 is coupled to the power supply unit 33, the current flows from the wiring layer 41 to the wiring layer 72 through the vias 43a through 43e, the connection members 95a through 95e, and the vias 73a through 73e, and is then supplied to the electronic component 34 coupled to the wiring layer 72.

As illustrated in FIG. 9B, the parts connecting to the wiring layer 41 of the vias 43a through 43e are respectively defined as connection parts 51a through 51. Here, the direction parallel to a short side 49 of the wiring layer 41 is defined as a first direction, and the direction parallel to a long side 50 is defined as a second direction. In the wiring layer 41, the line segment that passes through the connection part 51a and is parallel to the first direction is defined as a line segment 52a. In the same manner, the line segment that passes through the connection part 51b and is parallel to the first direction is defined as a line segment 52b, and the line segment that passes through the connection parts 51c and is parallel to the first direction is defined as a line segment 52c. The line segment that passes through the connection part 51d and is parallel to the first direction is defined as a line segment 52d, and the line segment that passes through the connection part 51e and is parallel to the first direction is defined as a line segment 52e. The line segments 52a through 52e are indicated by chain lines in FIG. 9B. The line segments 52a through 52e preferably pass through the respective centers of the connection parts 51a through 51e, but may pass through the part other than the center.

In the wiring layer 41, the region enclosed by the opposed long sides 50, the line segment 52a, and the line segment 52b is defined as a region 53a. In the same manner, the region enclosed by the opposed long sides 50, the line segment 52b, and the line segment 52c is defined as a region 53b, the region enclosed by the opposed long sides 50, the line segment 52c, and the line segment 52d is defined as a region 53c, and the region enclosed by the opposed long sides 50, the line segment 52d, and the line segment 52e is defined as a region 53d.

Apertures 54, which are holes penetrating through the wiring layer 41, are provided in the regions 53a through 53d. The diameters of the apertures 54 in the regions 53a through 53d are approximately the same. The number of the apertures 54 in each of the regions 53a through 53d increases in the order of the regions 53a, 53b, 53c, and 53d. That is, the number of the apertures 54 is the smallest in the region 53a located upstream in the flow direction of current, and increases in the order of the regions 53b, 53c, and 53d, i.e., as the region is located further downstream in the flow direction of current. Thus, for the areas of the regions 53a through 53d except the apertures 54, the region 53a is the largest, followed by the regions 53b, 53c, and 53d. Thus, among the regions 53a through 53d, the region 53a has the smallest electrical resistance, followed by the regions 53b, 53c, and 53d.

As illustrated in FIG. 9C, the parts connecting to the wiring layer 72 of the vias 73a through 73e are defined as connection parts 88a through 88e, respectively. Here, the direction parallel to a short side 86 of the wiring layer 72 is defined as a third direction, and the direction parallel to a long side 87 is defined as a fourth direction. In the wiring layer 72, the line segment that passes through the connection part 88a and is parallel to the third direction is defined as a line segment 89a. In the same manner, the line segment that passes through the connection part 88b and is parallel to the third direction is defined as a line segment 89b, and the line segment that passes through the connection part 88c and is parallel to the third direction is defined as a line segment 89c. The line segment that passes through the connection part 88d and is parallel to the third direction is defined as a line segment 89d, and the line segment that passes through the connection parts 88e and is parallel to the third direction is defined as a line segment 89e. The line segments 89a through 89e are indicated by chain lines in FIG. 9C. The line segments 89a through 89e preferably pass through the centers of the connection parts 88a through 88e, respectively, but may pass through the parts other than the centers.

In the wiring layer 72, the region enclosed by the opposed long sides 87, the line segment 89a, and the line segment 89b is defined as a region 90a. In the same manner, the region enclosed by the opposed long sides 87, the line segment 89b, and the line segment 89c is defined as a region 90b, the region enclosed by the opposed long sides 87, the line segment 89c, and the line segment 89d is defined as a region 90c, and the region enclosed by the opposed long sides 87, the line segment 89d, and the line segment 89e is defined as a region 90d.

Apertures 91, which are holes penetrating through the wiring layer 72, are provided in the regions 90a through 90d. The diameters of the apertures 91 in the regions 90a through 90d are approximately the same. For the numbers of the apertures 91 in the regions 90a through 90d, the number of the apertures 91 is the largest in the region 90a, followed by the regions 90b, 90c, and 90d. That is, the number of the apertures 91 is the largest in the region 90a located upstream in the flow direction of current, and decreases in the order of the regions 90b, 90c, and 90d, i.e., as the region is located further downstream in the flow direction of current. Thus, for the areas of the regions 90a through 90d except the apertures 91, the region 90a is the smallest, followed by the regions 90b, 90c, and 90d. Thus, among the regions 90a through 90d, the electrical resistance of the region 90a is the largest, and the electrical resistance decreases in the order of the regions 90b, 90c, and 90d.

A case where the apertures 54 and 91 are circular holes has been described as an example, but the apertures 54 and 91 may be rectangular holes or elliptical holes. The wiring layer 41 may have a structure in which one aperture is provided in each of the regions 53a through 53d as in FIG. 7A and the area of the aperture increases in the order of the regions 53a, 53b, 53c, and 53d. As in FIG. 7B, the aperture may be a cutout. The wiring layer 72 may have a structure in which one aperture is provided in each of the regions 90a through 90d as in FIG. 8A and the area of the aperture decreases in the order of the regions 90a, 90b, 90c, and 90d. As in FIG. 8B, the aperture may be a cutout.

In the second embodiment, as illustrated in FIG. 9B, in the wiring layer 41, the area of the region 53a except the aperture 54 is greater than the area of the region 53b except the apertures 54. In addition, in the wiring layer 41, the area of the region 53b except the apertures 54 is greater than the area of the region 53c except the apertures 54. Furthermore, in the wiring layer 41, the area of the region 53c except the apertures 54 is greater than the area of the region 53d except the apertures 54. Accordingly, the electrical resistance of the wiring layer 41 gradually increases from the upstream to the downstream side in the flow direction of current. Thus, as in the first embodiment, the current is inhibited from crowding into the vias 43a and 43e at both ends among the vias 43a through 43e. Thus, the current evenly flows through the vias 43a through 43e. Since the current evenly flows through the vias 43a through 43e, the current also evenly flows through the connection members 95a through 95e and the vias 73a through 73e. Thus, a break due to electromigration is inhibited from occurring in the vias 43a through 43e, the connection members 95a through 95e, and the vias 73a through 73e.

As illustrated in FIG. 9C, in the wiring layer 72, the area of the region 90a except the apertures 91 is less than the area of the region 90b except the apertures 91. In addition, in the wiring layer 72, the area of the region 90b except the apertures 91 is less than the area of the region 90c except the apertures 91. Furthermore, in the wiring layer 72, the area of the region 90c except the apertures 91 is less than area of the region 90d except the aperture 91. Accordingly, the electrical resistance of the wiring layer 72 gradually decreases from the upstream to the downstream side in the flow direction of current. Thus, as in the first embodiment, the current effectively evenly flows through the vias 43a through 43e thanks to the synergy with the advantage obtained by gradually increasing the electrical resistance of the wiring layer 41 from the upstream to the downstream side in the flow direction of current.

As illustrated in FIG. 9A, the power supply unit 33 is preferably provided to the substrate 210, and the wiring layers 41 and 72 are preferably power supply layers to which a power-supply voltage is supplied from the power supply unit 33 and through which the current flows. When the wiring layers 41 and 72 are power supply layers, large current flows through the wiring layers 41 and 72. Thus, when the current crowds into the vias 43a and 43e at both ends among the vias 43a through 43e, a break due to electromigration is likely to occur. Therefore, when the wiring layers 41 and 72 are power supply layers, the aperture 54 is preferably provided in the wiring layer 41. The wiring layers 41 and 72 are not limited to power supply layers, and may be ground layers through which current flows from the electronic component 34 to a ground.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A substrate including a first wiring layer coupled to another wiring layer through a plurality of vias, wherein
the first wiring layer has a structure in which
an area of a first region, which is enclosed by a first line segment and a second line segment, except an aperture located in the first region is greater than an area of a second region, which is enclosed by the second line segment and a third line segment, except an aperture located in the second region, the first line segment passing through a first connection part of a first via of the plurality of vias and being parallel to a first short side of the first wiring layer, the second line segment passing through a second connection part of a second via of the plurality of vias and being parallel to the first short side, the third line segment passing through a third connection part of a third via of the plurality of vias and being parallel to the first short side, the first connection part, the second connection part, and the third connection part being connected to the first wiring layer.

2. The substrate according to claim 1, further comprising:
a second wiring layer coupled to the first wiring layer through the plurality of vias, wherein
the second wiring layer has a structure in which
an area of a third region, which is enclosed by a fourth line segment and a fifth line segment, except an aperture located in the third region is less than an area of a fourth region, which is enclosed by the fifth line segment and a sixth line segment, except an aperture located in the fourth region, the fourth line segment passing through a fourth connection part of the first via and being parallel to a second short side of the second wiring layer, the fifth line segment passing through a fifth connection part of the second via and being parallel to the second short side, the sixth line segment passing through a sixth connection part of the third via and being parallel to the second short side, the fourth connection part, the fifth connection part, and the sixth connection part being connected to the second wiring layer.

3. The substrate according to claim 2, wherein
the first region is located further upstream than the second region in a flow direction of current flowing through the first wiring layer, and
the third region is located further upstream than the fourth region in a flow direction of current flowing through the second wiring layer.

4. The substrate according to claim 2, wherein
a number of the apertures located in the third region is greater than a number of the apertures located in the fourth region.

5. The substrate according to claim 2, wherein
a number of the apertures located in the third region is one,
a number of the apertures located in the fourth region is one, and
the aperture located in the third region is larger than the aperture located in the fourth region.

6. The substrate according to claim 2, wherein
the aperture located in the third region and the aperture located in the fourth region are cutouts located at a second long side of the second wiring layer.

7. The substrate according to claim 2, wherein
a sum of an area of the aperture located in the third region is greater than a sum of an area of the aperture located in the fourth region.

8. The substrate according to claim 2, wherein
the aperture located in the third region and the aperture located in the fourth region penetrate through the second wiring layer.

9. The substrate according to claim 1, wherein
a number of the apertures located in the first region is less than a number of the apertures located in the second region.

10. The substrate according to claim 1, wherein
a number of the apertures located in the first region is one,
a number of the apertures located in the second region is one, and
the aperture located in the first region is smaller than the aperture located in the second region.

11. The substrate according to claim 1, wherein
the aperture located in the first region and the aperture located in the second region are cutouts located at a first long side of the first wiring layer.

12. The substrate according to claim 1, wherein
a sum of an area of the aperture located in the first region is less than a sum of an area of the aperture located in the second region.

13. The substrate according to claim 2, wherein
the first wiring layer and the second wiring layer are power supply layers to which current is supplied from a power supply unit or ground layers into which the current flows.

14. The substrate according to claim 1, wherein
the first wiring layer has a structure in which a length of a seventh line segment except the aperture located in the first region is longer than a length of an eighth line segment except the aperture located in the second region, the seventh line segment passing through the aperture located in the first region and being parallel to the first short side, the eighth line segment passing through the aperture located in the second region and being parallel to the first short side.

15. The substrate according to claim 1, wherein
the plurality of vias are arranged next to each other from an end of the first wiring layer, and are coupled to the first wiring layer.

16. The substrate according to claim 1, wherein
the aperture located in the first region and the aperture located in the second region penetrate though the first wiring layer.

17. An electronic device including a substrate having a first wiring layer coupled to another wiring layer through a plurality of vias, wherein
the first wiring layer has a structure in which
an area of a first region, which is enclosed by a first line segment and a second line segment, except an aperture located in the first region is greater than an area of a second region, which is enclosed by the second line segment and a third line segment, except an aperture located in the second region, the first line segment passing through a first connection part of a first via of the plurality of vias and being parallel to a first short side of the first wiring layer, the second line segment passing through a second connection part of a second via of the plurality of vias and being parallel to the first short side, the third line segment passing through a third connection part of a third via of the plurality of vias and being parallel to the first short side, the first connection part, the second connection part, and the third connection part being connected to the first wiring layer.

* * * * *